(12) United States Patent
Ireland et al.

(10) Patent No.: US 6,667,531 B1
(45) Date of Patent: Dec. 23, 2003

(54) METHOD AND APPARATUS FOR A DEPOSITED FILL LAYER

(75) Inventors: Philip J. Ireland, Nampa, ID (US); Werner Juengling, Boise, ID (US); Stephen M. Krazit, Irving, TX (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/230,960

(22) Filed: Aug. 29, 2002

(51) Int. Cl.[7] .............................................. H02L 29/00
(52) U.S. Cl. ...................... 257/510; 257/508; 257/513
(58) Field of Search ................................. 257/510, 752, 257/513, 758, 734, 750; 438/666, 218; 283/94; 101/463.1

(56) References Cited

U.S. PATENT DOCUMENTS

| | | | | |
|---|---|---|---|---|
| 5,448,102 A | * | 9/1995 | Gaul et al. .................. | 257/510 |
| 5,863,075 A | * | 1/1999 | Rich et al. ................... | 283/94 |
| 5,965,940 A | | 10/1999 | Juengling ..................... | 257/752 |
| 5,981,384 A | | 11/1999 | Juengling ..................... | 438/666 |
| 6,274,419 B1 | * | 8/2001 | Omid-Zohoor et al. ..... | 438/218 |
| 2003/0061958 A1 | * | 4/2003 | Zhang ......................... | 101/463.1 |

* cited by examiner

*Primary Examiner*—David Nelms
*Assistant Examiner*—Thinh T. Nguyen
(74) *Attorney, Agent, or Firm*—Schwegman, Lundberg, Woessner & Kluth, P.A.

(57) ABSTRACT

A method of forming a semiconducting wafer is provided that utilizes fewer processing operations, reduces process variation, and lowers cost as well as production time. The method provided further improves via reliability by permitting vias to be formed with consistent aspect ratios. Devices and method are provided that substantially eliminate four way intersections on semiconductor wafers between conducting elements and supplemental elements. The devices and methods provide a more uniform deposition rate of a subsequent dielectric layer. Four way intersections are removed from both conductive element regions as well as supplemental element regions.

35 Claims, 6 Drawing Sheets

METHOD AND APPARATUS FOR A DEPOSITED FILL LAYER

CROSS-REFERENCE TO RELATED APPLICATIONS

This application is related to the following co-pending, commonly assigned U.S. patent application: "Metal-Fill Pattern Generation," U.S. Ser. No. 10/202,953 filed Aug. 28, 2002 of which the disclosure is herein incorporated by reference in its entirety.

FIELD OF THE INVENTION

The invention relates to semiconductor wafers and semiconductor devices and their fabrication. Specifically, the invention relates to methods of fabricating layers on a semiconductor wafer, and the semiconductor devices that result from the methods.

BACKGROUND OF THE INVENTION

Semiconductor integrated circuits are formed using large numbers of complex processing operations to form several layers of devices and electrical connections stacked on top of each other. Isolating layers of dielectric material are needed to electrically isolate semiconductor devices and electrical connecting lines from each other. The dielectric material is typically deposited in lateral spaces between elements such as semiconductor devices and between electrical connections such as trace lines. The dielectric material is also deposited between multiple layers of devices or connections to isolate portions of layers from each other.

FIG. 1 shows an integrated circuit 100, including a semiconductor substrate 110. The integrated circuit 100 includes a number of semiconductor devices 120 that are formed on, or within the substrate 110. Electrical connections such as first electrical connection 130 and second electrical connection 132 are included for interconnecting selected semiconductor devices 120.

Current fabrication methods utilize a multiple step process to isolate various elements of the integrated circuit 100 as described. A first dielectric layer 150 is included in the multiple step process. The first dielectric layer 150 is shown in FIG. 1 located over the electrical connections 130 and 132. The dielectric layer 150 in common configurations is a conformal layer that contacts both a substrate elevation level area 112 and an element elevation level area 114.

One current technique also utilizes supplemental structures such as structure 140 to minimize the amount of surface area on the substrate 110 that is at the substrate elevation level 112. However, with the configuration shown in FIG. 1, there is still a substantial difference in elevation between the substrate elevation level 112 and the element elevation level 114. The conformal dielectric layer 150 of the current process does not yield a planar outer surface.

It is desirable to form a substantially planar outer surface so that stacks of layers including subsequent semiconductor devices or electrical connections can be formed as needed. Using the current process, additional dielectric layers such as second dielectric layer 160 are needed to form a substantially planar outer surface 162. The outer surface 162 is made planar by selecting the second dielectric material and deposition process such that remaining recesses 163 are filled in.

Currently, no process or product exists that forms the substantially planar outer surface 162 in a single processing operation, with a single layer of material. Multiple process operations, while often necessary, are undesirable because of added time and manufacturing cost associated with each additional operation.

A via 170 is further shown in FIG. 1, formed through the first dielectric layer 150 and the second dielectric layer 160. The via 170 is needed when utilizing subsequent device or electrical connection layers, to form an electrical contact that communicates with, for example, the second electrical connection 132 as shown.

The via 170 includes a via width 172. Because the via 170 passes through both the first dielectric layer 150 and the second dielectric layer 160 in order to reach the second electrical connection 132, the via has a height that is equal to a thickness 166. The thickness 166 is equal to a first dielectric layer thickness 152 added to a second dielectric layer thickness 164. The via 170 has an aspect ratio equal to its height over its width 172. Due to thickness variations introduced in each deposition operation, there is a large variation in aspect ratios of vias formed after two dielectric depositions. High aspect ratio vias can be difficult to fill with conductive material in later processing operations. Aspect ratio variations are thus undesirable because of the resulting low reliability of high aspect ratio vias.

What is needed is a method of processing a semiconductor wafer to form a semiconductor device or integrated circuit that uses fewer processing steps. What is also needed is a method of processing a semiconductor wafer to form a semiconductor device or integrated circuit that allows more controlled variation of via aspect ratios.

SUMMARY OF THE INVENTION

The above mentioned problems with semiconductor processing and resulting semiconductor devices are addressed by the present invention and will be understood by reading and studying the following specification. Systems, devices and methods are provided for processing a semiconductor wafer using fewer steps. The systems, devices, and methods of the present invention offer fewer processing steps while at the same time providing a planar surface and more reliable vias.

A method of fabricating a semiconductor wafer is provided. The method includes forming a pattern of elements on a semiconductor surface. Forming a pattern of elements includes forming a number of conductive elements on the semiconductor surface, the conductive elements being spaced apart from each other. Spaces between elements of the pattern define a number of trenches with trench axes that are substantially parallel to sides of adjacent elements of the pattern. This method of fabricating a semiconductor wafer further includes designing the pattern to substantially eliminate portions of the pattern where trench axes cross one another.

Other methods are provided that include forming a number of supplemental elements in selected regions on the semiconductor surface adjacent to the number of conductive elements, the supplemental elements being spaced apart from each other and the number of conductive elements. In one embodiment, the number of conductive elements include a number of conductive trace lines. In one embodiment, the number of conductive elements include metal. In one embodiment, the supplemental elements include metal supplemental elements. In one embodiment, the conductive elements and the supplemental elements are concurrently formed. Another embodiment further includes filling the number of trenches with a dielectric material to form a substantially planar surface. One process operation of filling the number of trenches with a dielectric material includes utilizing a spin-on-glass process. Another process operation of filling the number of trenches with a dielectric material includes a chemical vapor deposition (CVD) process. In one embodiment, filling the number of trenches with a dielectric material is accomplished in a single process operation. Methods of forming memory devices and information handling systems are also provided.

An integrated circuit is also provided. The integrated circuit includes a number of semiconductor devices formed on a semiconductor substrate. The integrated circuit also includes a pattern of elements on the semiconductor surface, the pattern including a number of conductive elements operatively coupling selected semiconductor devices to one another on the semiconductor surface, the conductive elements being spaced apart from each other. The pattern also includes a number of supplemental elements in selected regions on the semiconductor surface adjacent to the number of conductive elements, the supplemental elements being spaced apart from each other and the number of conductive elements. Spaces between elements of the pattern define a number of trenches with trench axes that are substantially parallel to sides of adjacent elements of the pattern, wherein no trench axes cross one another.

In one embodiment, the number of semiconductor devices includes a number of transistors. In one embodiment, the dielectric layer includes tetraethylorthosilicate (TEOS). In one embodiment, the dielectric layer includes silicon dioxide ($SiO_2$). Embodiments of integrated circuits are also provided as incorporated into memory devices and information handling systems.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION OF THE PREFERRED EMBODIMENTS

Figure 1:
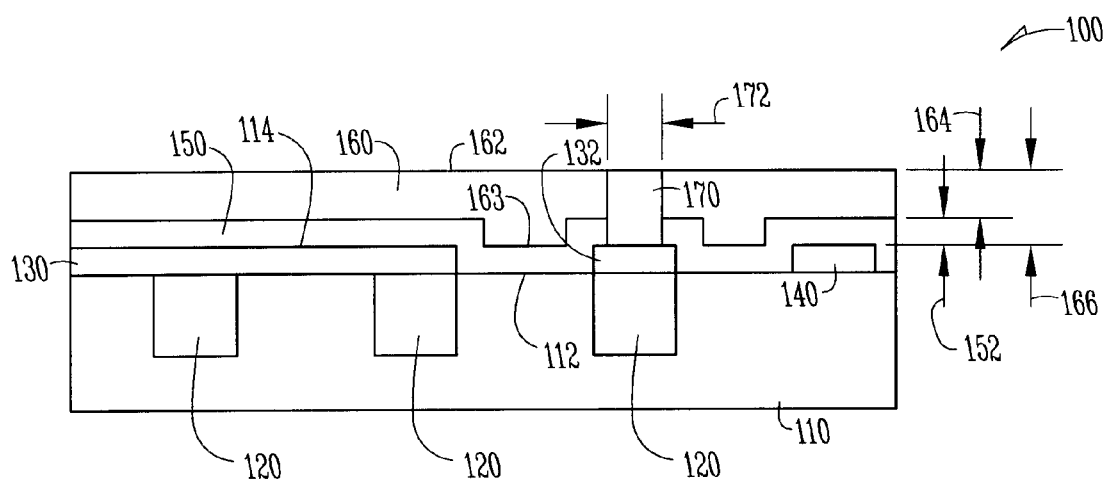
FIG. 1 shows an elevational view of an integrated circuit according to the prior art.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator (semiconductor-on-insulator—SOI), as well as other semiconductor structures well known to one skilled in the art. The term conductor is understood to include semiconductors, and the term insulator or dielectric is defined to include any material that is less electrically conductive than the materials referred to as conductors.

The term "horizontal" or "lateral" as used in this application is defined as a plane parallel to the conventional plane or surface of a wafer or substrate, regardless of the orientation of the wafer or substrate. The term "vertical" or "elevational" refers to a direction perpendicular to the horizonal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate.

The term "trench" is used in the present application to refer to a space between elements. One form of a trench is created by building up elements on a surface, thus creating spaces between the elements. Another form of trench is created by removing material from a substantially continuous layer to create elements. The spaces between the elements of the layer are also defined as trenches.

The following detailed description is, therefore, not to be taken in a limiting sense. The scope of the present invention is defined only by the appended claims, along with the full scope of equivalents to which such claims are entitled.

Figure 2:
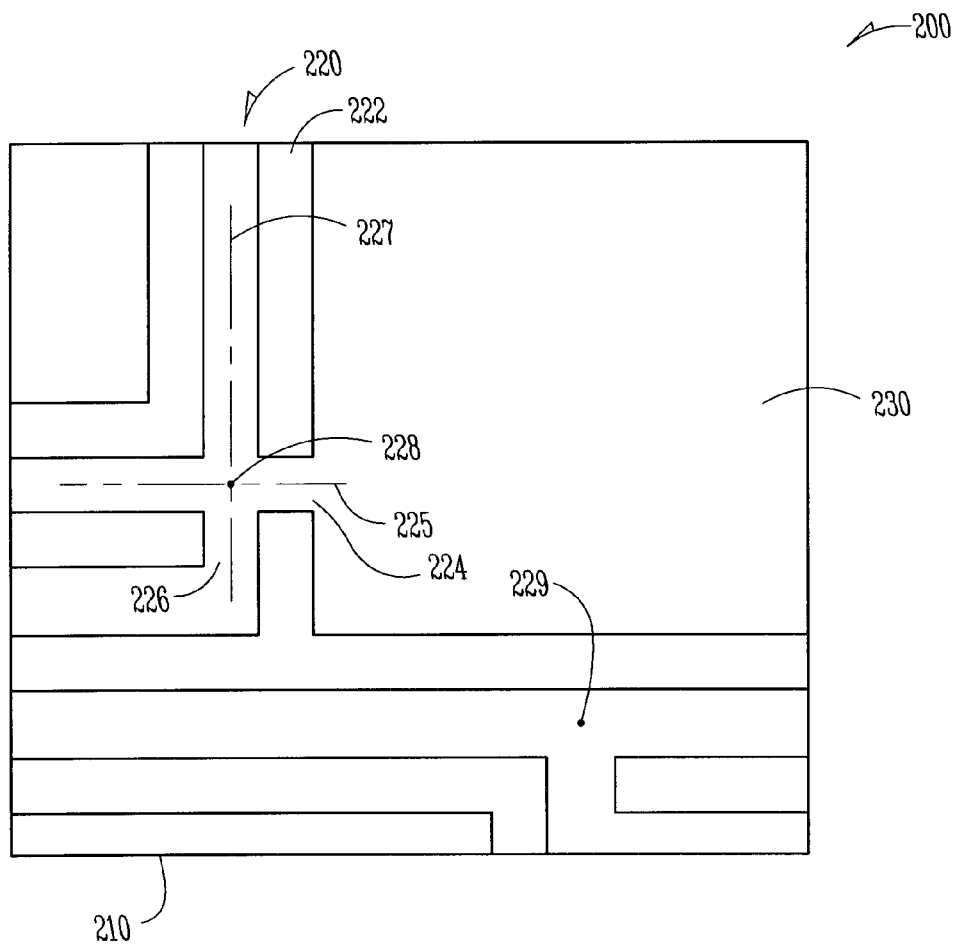
FIG. 2 shows a plan view of an integrated circuit according to the prior art.

FIG. 2 shows a current design of an integrated circuit (IC) 200. The IC 200 is formed on a substrate 210, and includes a first region 220 containing a number of conductive elements 222. In one embodiment, the conductive elements 222 include metal trace lines as are commonly known in the art. The IC 200 further includes a second region 230 that does not require any conductive elements 222. For a variety of reasons, a number of second regions 230 that do not require any conductive elements 222 may be included across a surface of a semiconductor wafer or an IC.

The conductive elements 222 shown in FIG. 2 extent outward from the substrate 210 to an elevation. The conductive elements 222 therefore define a number of trenches between individual conductive elements. A generally linear first trench 224 is shown with a first trench axis 225. A generally linear second trench 226 is also shown with a second trench axis 227. In the current embodiment of FIG. 2, an intersection 228 is shown where the first trench axis 225 crosses over the second trench axis 227. The intersection forms a "four way intersection" which is distinguishable from a "three way intersection" such as second intersection 229. In a three way intersection, the trench axes meet, but they do not cross one another.

It has recently been noted that during a dielectric layer deposition between elements on a substrate such as conductive elements 222, that four way intersections fill more slowly than other trench topography. Deposition over elements that include four way intersections is difficult due to the differences in fill rate. A single layer deposition is impractical because the four way intersections do not fill in a planar manner. When a second layer is used to planarize a surface over four way intersections, additional variations in thickness result that must be tunneled through if a via is to be connected to a conductive element below.

Figure 3A:
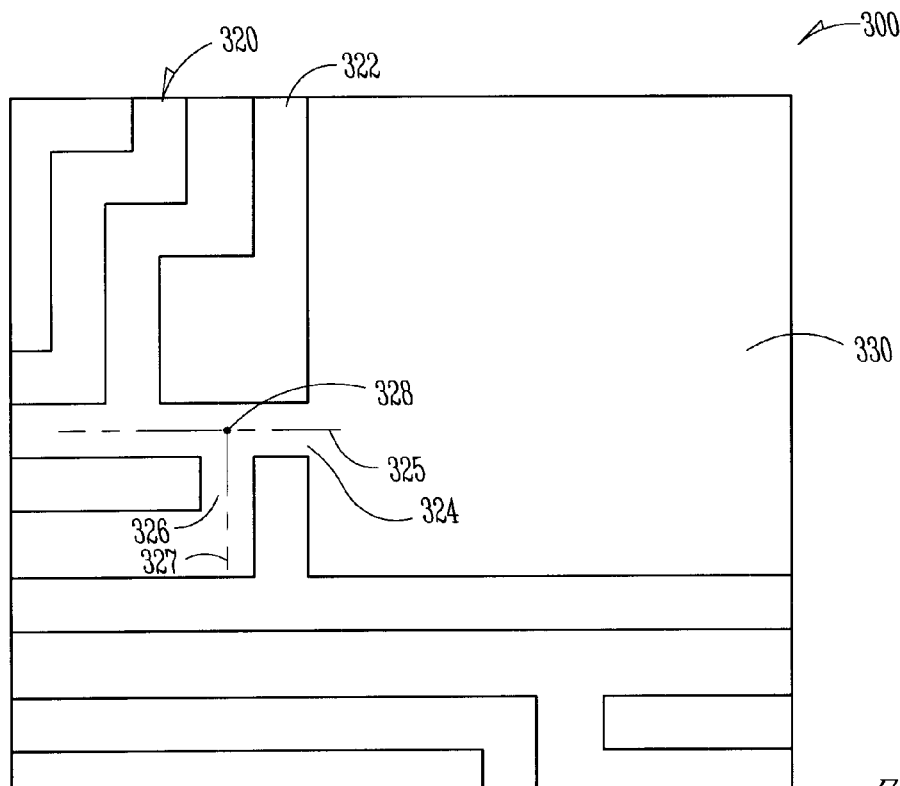
FIG. 3A shows a plan view of one embodiment of an integrated circuit according to the invention.

FIG. 3A shows an IC 300 that does not contain any four way intersections. The IC 300 is formed on a substrate 310, and includes a first region 320 containing a number of conductive elements 322. In one embodiment, the conductive elements 322 include metal trace lines as are commonly known in the art. In one embodiment, the conductive elements 322 are formed from a metal. Possible metals include, but are not limited to, tungsten, titanium, other refractory metals, or aluminum. Any number of possible shapes of conductive elements are possible. Trace lines, for instance, include straight lines, 90 degree turns, and other complex geometry. Functionally, the conductive elements must merely interconnect two or more semiconductor devices, such as transistors, to each other.

The IC 300 further includes a second region 330 that does not require any conductive elements 322. Any number of such regions 330 that do not require any conductive elements may be spread across the surface of the semiconductor substrate 310 in the IC 300. FIG. 3A shows a substantially square second region 330, however, other shapes including multiple sided complex shapes are also included in alternate embodiments. The exact shape of any of a number of second regions 330 is determined by locations of semiconductor devices, such as transistors, that require interconnection through conductive elements such as 322.

The conductive elements 322 shown in FIG. 3A extent outward from the substrate 310 to an elevation. The conductive elements 322 therefore define a number of trenches between individual conductive elements. A generally linear first trench 324 is shown with a first trench axis 325. A generally linear second trench 326 is also shown with a second trench axis 327. An intersection 328 is shown where the first trench axis 325 meets the second trench axis 327. The intersection forms a three way intersection as described above. The first trench axis 325 meets, but does not cross, the second trench axis 327.

Figure 3B:
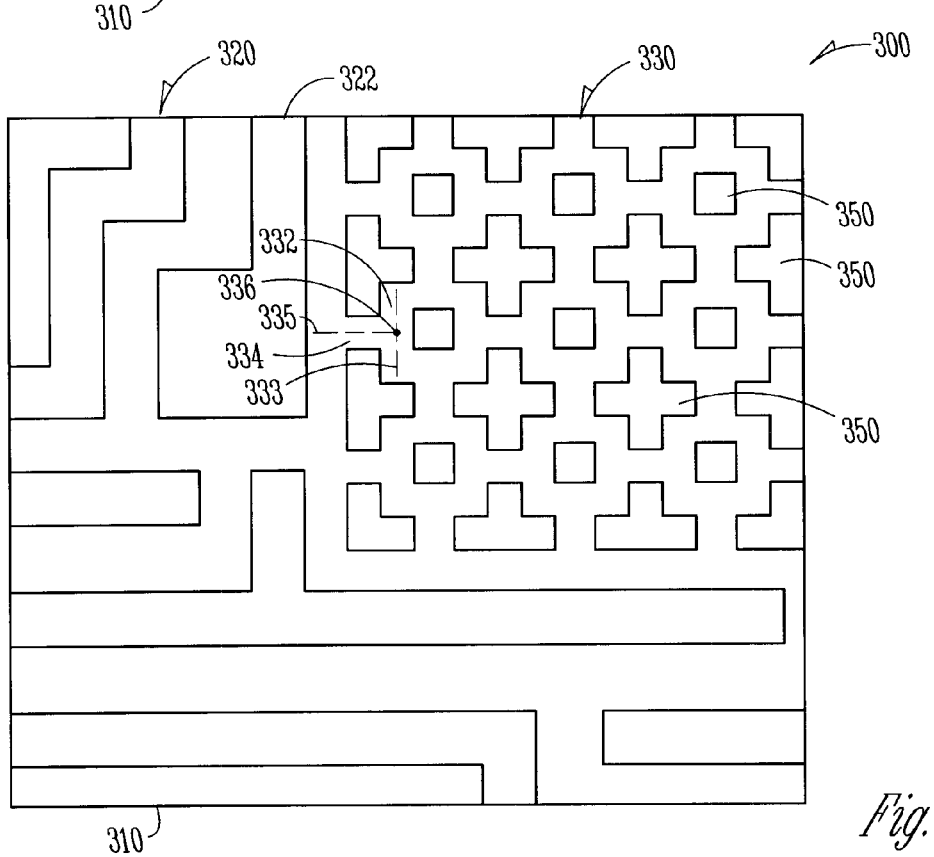
FIG. 3B shows a plan view of another embodiment of an integrated circuit according to the invention.

FIG. 3B shows the IC 300 with a further addition of a number of supplemental elements 350. The supplemental elements 350 are located within the second region 330. The supplemental elements 350 include a variety of possible shapes. Example shapes from one embodiment are shown in FIG. 3B as squares, "cross" shapes, and partial "cross" shapes. In one embodiment, the supplemental elements 350 are formed from a metal. The supplemental elements are not required to conduct electrical signals, therefore they need not be conductive. In one embodiment, the supplemental elements 350 are formed from the same material as the conductive elements 322. In one embodiment, the supplemental elements are formed in a single process operation along with the conductive elements.

The use of supplemental elements aids in the subsequent step of isolation using a dielectric layer as described above. If the second region 330 is left open the deposition process kinetics lead to a depression in the second region while the dielectric material layer deposits more fully in "trenched" areas such as 320. A more uniform deposition process is achieved when spaces between all elements are substantially the same. In the embodiments shown in FIGS. 3A and 3B, the trenches shown are all substantially the same width as measured perpendicular to the trench axes, thus in the embodiments shown in FIGS. 3A and 3B, spaces between all elements are substantially the same.

The supplemental elements 350 shown in FIG. 3B extent outward from the substrate 310 to an elevation. In one embodiment, the elevation of the supplemental elements 350 is substantially the same as the elevation of the conductive elements 322. The supplemental elements 350 therefore define a number of trenches between individual supplemental elements. A generally linear third trench 332 is shown with a third trench axis 333. A generally linear fourth trench 334 is also shown with a fourth trench axis 335. An intersection 336 is shown where the third trench axis 333 meets the fourth trench axis 335. The intersection forms a three way intersection as described above. The third trench axis 333 meets, but does not cross, the fourth trench axis 335.

The IC 300 does not include any four way intersections in either the first region 320 or the second region 330. This design has a number of advantages. First, filling in regions such as 330 and making spaces all substantially equal in regions such as 320 and 330 makes the photo patterning more robust, and the dry etch patterning more uniform. Then, by eliminating four way intersections, the subsequent dielectric deposition process kinetics are further improved beyond the kinetics achieved with the substantially equal spaces. By eliminating four way intersections, all regions tend to fill more uniformly, which allows a thinner dielectric layer deposition that fills all holes. Additionally, the even fill rate of this novel design allows the isolation layer to be formed in a single process operation. The single layer deposition with a uniform fill rate does not leave pits or deep depressed regions that need to be filled by a subsequent material and deposition operation. The resulting dielectric layer possesses a substantially planar top surface, (max.-min. topographic feature height differences of approximately 200–500 Å) and only introduces thickness variations from a single process step in contrast to a two layer deposition. In one embodiment, a subsequent buffing operation further removes the 200–500 Å surface roughness variation in preparation for subsequent semiconductor device layers. A dielectric layer with less localized thickness variation, as well as less global thickness variation, is thus produced using the novel design methods as described above.

Figure 4A:
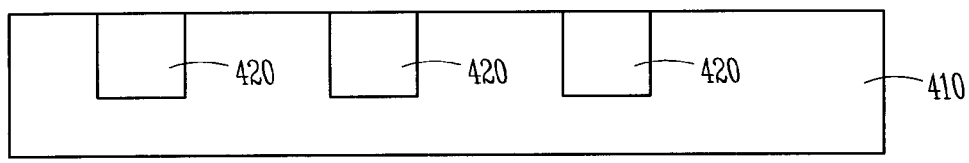
FIG. 4A shows an elevational view of a semiconductor wafer during processing according to one embodiment of the invention.

FIG. 4A shows a semiconductor wafer that includes a substrate 410 and a number of semiconductor devices 420 formed within the substrate 410. One skilled in the art will recognize that semiconductor devices 420 may also be formed partially within the substrate 410, or merely attached to a surface of the substrate 410. Semiconductor devices 420 include, but are not limited to, transistors, storage capacitors, diodes, etc.

Figure 4B:
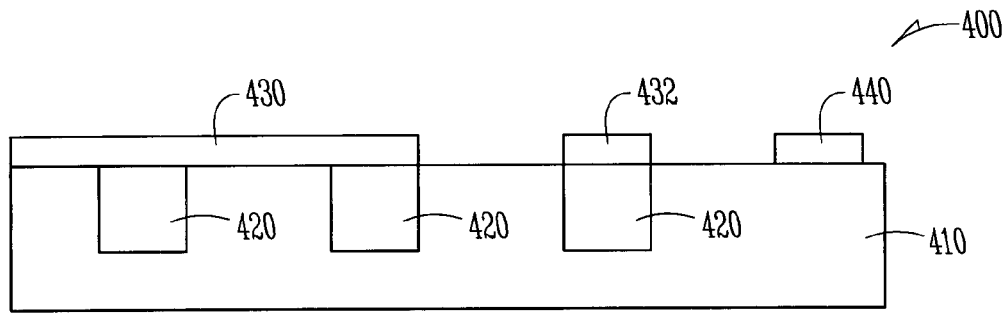
FIG. 4B shows an elevational view of a semiconductor wafer during processing according to one embodiment of the invention.

FIG. 4B shows the addition of a first conducting element 430 and a second conducting element 432. Selected semiconductor devices 420 are interconnected by the first conducting element 430. Also shown is a supplemental element 440.

Figure 4C:
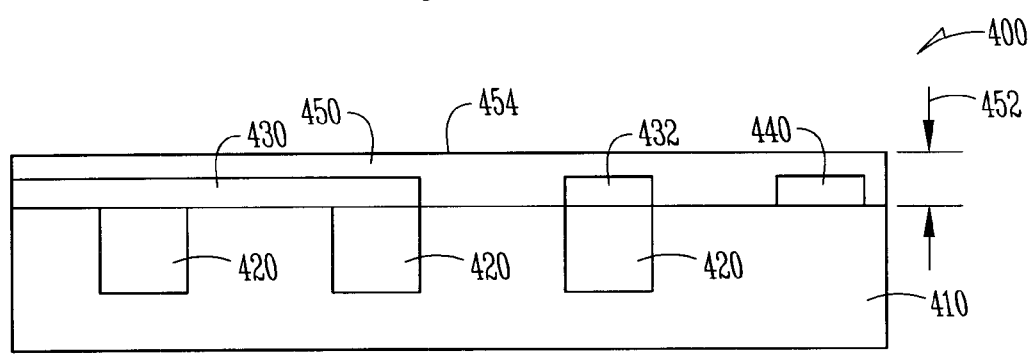
FIG. 4C shows an elevational view of a semiconductor wafer during processing according to one embodiment of the invention.

FIG. 4C shows a dielectric layer 450 that is deposited over the conducting elements 430, 432 and the supplemental element 440. The dielectric layer is deposited to a thickness 452. As described above, the thickness 452 is more reproducible, locally across the wafer, as well as from wafer to wafer within a production fabrication. At the same time, a dielectric surface. 454 is substantially planar to allow subsequent layers of semiconductor devices or additional conducting element layers to be applied without additional surface preparation.

Figure 4D:
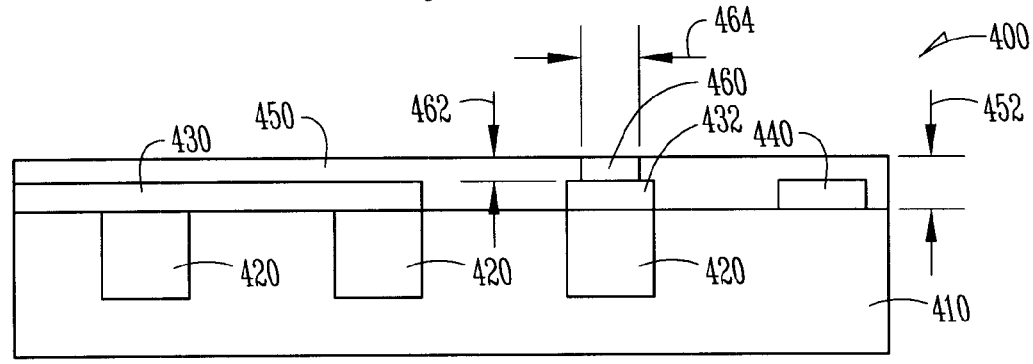
FIG. 4D shows an elevational view of a semiconductor wafer according to another embodiment of the invention.

FIG. 4D shows a via 460 that has been created within the dielectric layer 450. The via 460 has a height 462 and a width 464 that define an aspect ratio of the via 460. The via 460 can be formed in the single deposition dielectric layer 450 with a much more consistent aspect ratio due to the more consistent thickness 452 of the dielectric layer 450. This yields a more reliable IC because the vias 460 are consistently easy to fill with conductive material in contrast to IC's that have variations in thickness and include higher aspect ratio vias.

Figure 5:
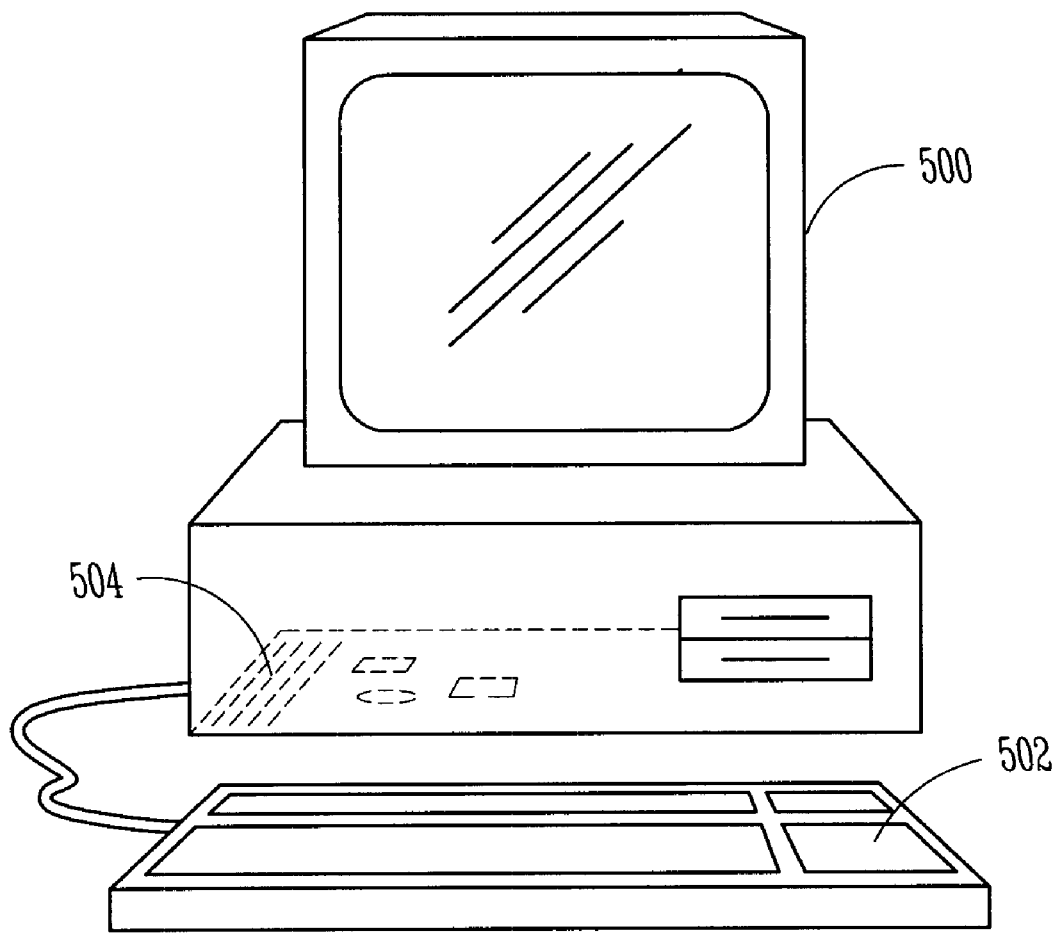
FIG. 5 shows a perspective view of an information handling device according to one embodiment of the invention.
Figure 6:
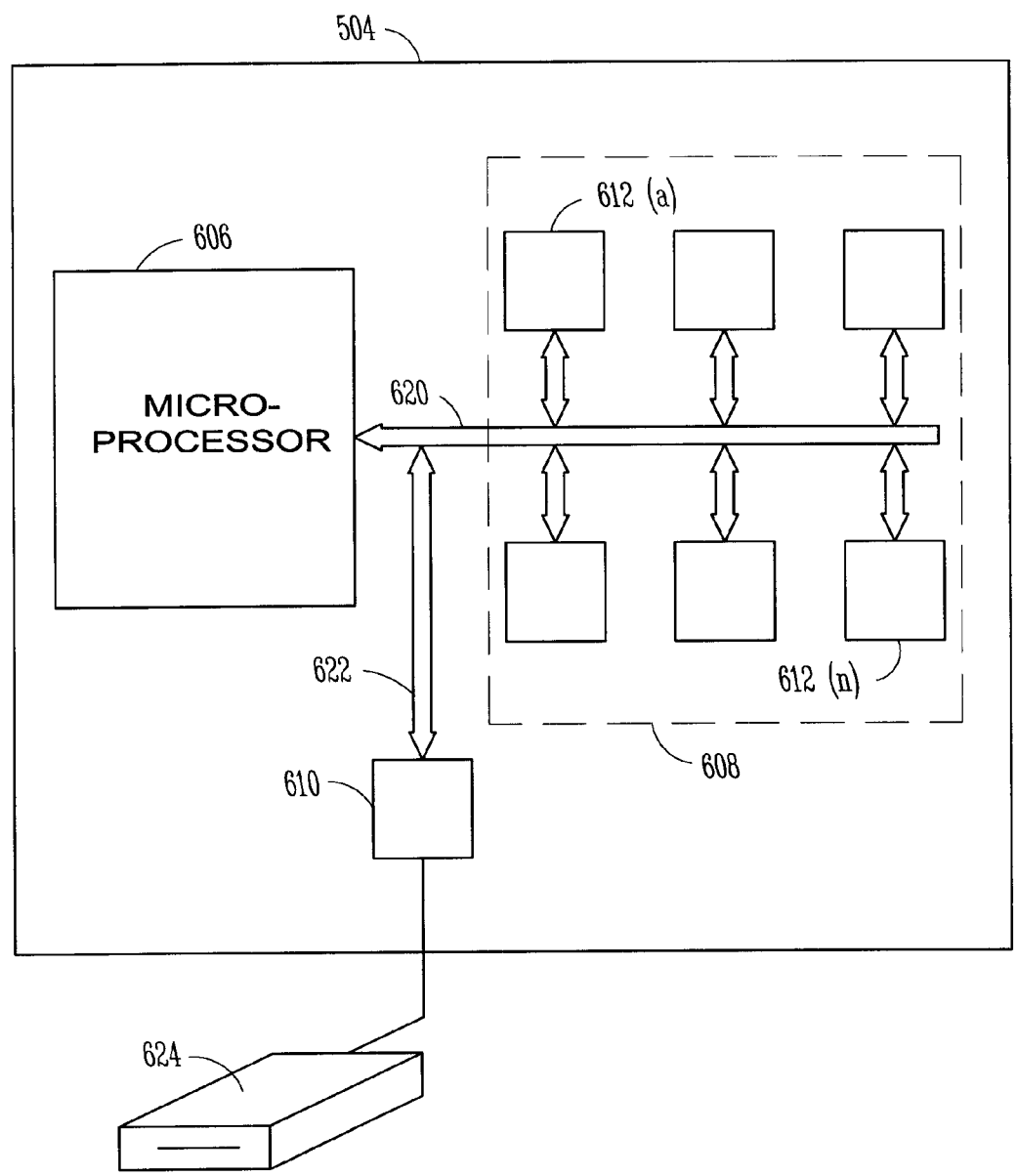
FIG. 6 shows a schematic view of a central processing unit according to one embodiment of the invention.
Figure 7:
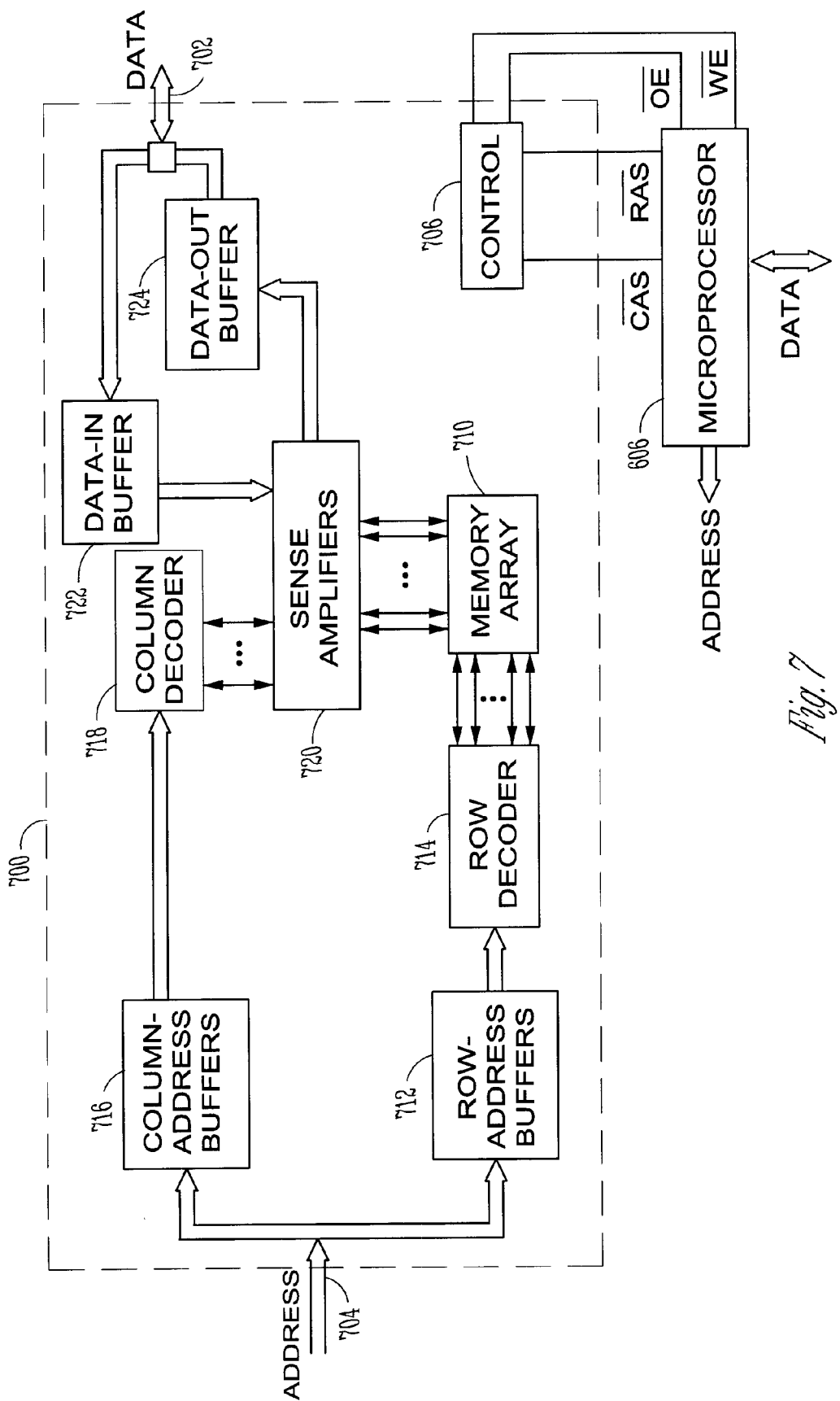
FIG. 7 shows a schematic view of a memory device according to one embodiment of the invention.

Semiconducting wafers and IC's created by the methods described above may be implemented into memory devices and information handling devices as shown in FIG. 5, FIG. 6, and FIG. 7 and as described below. While specific types of memory devices and computing devices are shown below, it will be recognized by one skilled in the art that several types of memory devices and information handling devices could utilize the invention.

A personal computer, as shown in FIGS. 5 and 6, includes a monitor 500, keyboard input 502 and a central processing unit 504. The processor unit typically includes microprocessor 606, memory bus circuit 608 having a plurality of memory slots 612(*a–n*), and other peripheral circuitry 610. Peripheral circuitry 610 permits various peripheral devices 624 to interface processor-memory bus 620 over input/output (I/O) bus 622. The personal computer shown in FIGS. 5 and 6 also includes at least one transistor having a gate oxide according to the teachings of the present invention.

Microprocessor 606 produces control and address signals to control the exchange of data between memory bus circuit 608 and microprocessor 606 and between memory bus circuit 608 and peripheral circuitry 610. This exchange of data is accomplished over high speed memory bus 620 and over high speed I/O bus 622.

Coupled to memory bus 620 are a plurality of memory slots 612(*a–n*) which receive memory devices well known to those skilled in the art. For example, single in-line memory modules (SIMMs) and dual in-line memory modules (DIMMs) may be used in the implementation of the present invention.

These memory devices can be produced in a variety of designs which provide different methods of reading from and writing to the dynamic memory cells of memory slots 612. One such method is the page mode operation. Page mode operations in a DRAM are defined by the method of accessing a row of a memory cell arrays and randomly accessing different columns of the array. Data stored at the row and column intersection can be read and output while that column is accessed. Page mode DRAMs require access steps which limit the communication speed of memory circuit 608. A typical communication speed for a DRAM device using page mode is approximately 33 MHZ.

An alternate type of device is the extended data output (EDO) memory which allows data stored at a memory array address to be available as output after the addressed column has been closed. This memory can increase some communication speeds by allowing shorter access signals without reducing the time in which memory output data is available on memory bus 620. Other alternative types of devices include SDRAM, DDR SDRAM, SLDRAM and Direct RDRAM as well as others such as SRAM or Flash memories.

FIG. 7 is a block diagram of an illustrative DRAM device 700 compatible with memory slots 612(*a–n*). The description of DRAM 700 has been simplified for purposes of illustrating a DRAM memory device and is not intended to be a complete description of all the features of a DRAM. Those skilled in the art will recognize that a wide variety of memory devices may be used in the implementation of the present invention. The example of a DRAM memory device shown in FIG. 7 includes at least one transistor having a gate oxide according to the teachings of the present invention.

Control, address and data information provided over memory bus 620 is further represented by individual inputs to DRAM 700, as shown in FIG. 7. These individual representations are illustrated by data lines 702, address lines 704 and various discrete lines directed to control logic 706.

As is well known in the art, DRAM 700 includes memory array 710 which in turn comprises rows and columns of addressable memory cells. Each memory cell in a row is coupled to a common wordline. Additionally, each memory cell in a column is coupled to a common bitline. Each cell in memory array 710 includes a storage capacitor and an access transistor as is conventional in the art.

DRAM 700 interfaces with, for example, microprocessor 606 through address lines 704 and data lines 702. Alternatively, DRAM 700 may interface with a DRAM controller, a micro-controller, a chip set or other electronic system. Microprocessor 606 also provides a number of control signals to DRAM 700, including but not limited to, row and column address strobe signals RAS and CAS, write enable signal WE, an output enable signal OE and other conventional control signals.

Row address buffer 712 and row decoder 714 receive and decode row addresses from row address signals provided on address lines 704 by microprocessor 606. Each unique row address corresponds to a row of cells in memory array 710. Row decoder 714 includes a wordline driver, an address decoder tree, and circuitry which translates a given row address received from row address buffers 712 and selectively activates the appropriate wordline of memory array 710 via the wordline drivers.

Column address buffer 716 and column decoder 718 receive and decode column address signals provided on address lines 704. Column decoder 718 also determines when a column is defective and the address of a replacement column. Column decoder 718 is coupled to sense amplifiers 720. Sense amplifiers 720 are coupled to complementary pairs of bitlines of memory array 710.

Sense amplifiers 720 are coupled to data-in buffer 722 and data-out buffer 724. Data-in buffers 722 and data-out buffers 724 are coupled to data lines 702. During a write operation, data lines 702 provide data to data-in buffer 722. Sense amplifier 720 receives data from data-in buffer 722 and stores the data in memory array 710 as a charge on a capacitor of a cell at an address specified on address lines 704.

During a read operation, DRAM 700 transfers data to microprocessor 606 from memory array 710. Complementary bitlines for the accessed cell are equilibrated during a precharge operation to a reference voltage provided by an equilibration circuit and a reference voltage supply. The charge stored in the accessed cell is then shared with the associated bitlines. A sense amplifier of sense amplifiers 720 detects and amplifies a difference in voltage between the complementary bitlines. The sense amplifier passes the amplified voltage to data-out buffer 724.

Control logic 706 is used to control the many available functions of DRAM 700. In addition, various control circuits and signals not detailed herein initiate and synchronize DRAM 700 operation as known to those skilled in the art. As stated above, the description of DRAM 700 has been simplified for purposes of illustrating the present invention and is not intended to be a complete description of all the features of a DRAM.

Those skilled in the art will recognize that a wide variety of memory devices, including but not limited to, SDRAMs, SLDRAMs, RDRAMs and other DRAMs and SRAMs, VRAMs and EEPROMs, may be used in the implementation of the present invention. The DRAM implementation described herein is illustrative only and not intended to be exclusive or limiting.

Conclusion

Thus has been shown a method of forming a semiconducting wafer that utilizes fewer processing operations than prior methods. The method shown further improves reliability of the devices formed by permitting vias to be formed with more consistent aspect ratios.

The present teachings recognize, among other novel aspects, that a relation of a fundamental wafer design that affects properties such as deposition kinetics. One specific teaching recognizes that elimination of four way intersections on semiconductor wafers between conducting elements and supplemental elements yields a more uniform deposition rate of a subsequent dielectric layer. In embodiments described above, four way intersections are removed from both conductive element regions as well as supplemental element regions.

The more uniform deposition rate allows use of a single process operation to deposit a thin, consistent dielectric layer that includes a substantially planar surface. The thinner dielectric layer allows a more consistent aspect ratio via to interconnect subsequent layers of semiconductor devices or conductive elements.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A method of fabricating a semiconductor wafer, comprising:
   forming a pattern of elements on a semiconductor surface, including:
      forming a number of conductive elements on the semiconductor surface, the conductive elements being spaced apart from each other;
   wherein spaces between elements of the pattern define a number of trenches with trench axes that are substantially parallel to sides of adjacent elements of the pattern; and
   designing the pattern to substantially eliminate portions of the pattern where trench axes cross one another.

2. The method of claim 1, wherein forming a pattern of elements on a semiconductor surface further includes forming a number of supplemental elements in selected regions on the semiconductor surface adjacent to the number of conductive elements, the supplemental elements being spaced apart from each other and the number of conductive elements.

3. The method of claim 1, wherein forming the number of conductive elements includes forming a number of conductive trace lines.

4. The method of claim 1, wherein forming the number of conductive elements include forming a number of metal conductive elements.

5. The method of claim 2, wherein forming the number of supplemental elements includes forming a number of metal supplemental elements.

6. The method of claim 2, wherein forming the number of conductive elements and forming the number of supplemental elements includes concurrently forming a number of conductive elements and a number of supplemental elements.

7. The method of claim 1, further including filling the number of trenches with a dielectric material to form a substantially planar surface.

8. The method of claim 7, wherein filling the number of trenches with a dielectric material includes utilizing a spin-on-glass process to form a substantially planar surface.

9. The method of claim 7, wherein filling the number of trenches with a dielectric material includes utilizing a chemical vapor deposition (CVD) process to form a substantially planar surface.

10. The method of claim 7, wherein filling the number of trenches with a dielectric material to form a substantially planar surface includes utilizing a single process operation to fill the number of trenches with a dielectric material to form a substantially planar surface.

11. A method of fabricating a memory array, comprising:
   forming a number of memory cells on a semiconductor surface;
   forming a pattern of elements on the semiconductor surface, including:
      interconnecting selected memory cells using a number of conductive elements on the semiconductor surface, the conductive elements being spaced apart from each other; and
      forming a number of supplemental elements in selected regions on the semiconductor surface adjacent to the number of conductive elements, the supplemental elements being spaced apart from each other and the number of conductive elements;
   wherein spaces between elements of the pattern define a number of trenches with trench axes that are substantially parallel to sides of adjacent elements of the pattern; and
   designing the pattern to substantially eliminate portions of the pattern where trench axes cross one another.

12. The method of claim 11, wherein forming the number of conductive elements includes forming a number of conductive metal trace lines.

13. The method of claim 11, wherein forming the number of supplemental elements includes forming a number of metal supplemental elements.

14. The method of claim 11, wherein forming the number of conductive elements and forming the number of supplemental elements includes concurrently forming a number of conductive elements and a number of supplemental elements.

15. The method of claim 11, further including filling the number of trenches with a dielectric material to form a substantially planar surface.

16. The method of claim 15, wherein filling the number of trenches with a dielectric material to form a substantially planar surface includes utilizing a single process operation to fill the number of trenches with a dielectric material to form a substantially planar surface.

17. A method of fabricating an information handling device, comprising:
- forming a memory array, including:
  - forming a number of memory cells on a semiconductor surface; and
  - forming a pattern of elements on the semiconductor surface, including:
    - interconnecting selected memory cells using a number of conductive elements on the semiconductor surface, the conductive elements being spaced apart from each other;
    - forming a number of supplemental elements in selected regions on the semiconductor surface adjacent to the number of conductive elements, the supplemental elements being spaced apart from each other and the number of conductive elements;
  - wherein spaces between elements of the pattern define a number of trenches with trench axes that are substantially parallel to sides of adjacent elements of the pattern;
  - designing the pattern to substantially eliminate portions of the pattern where trench axes cross one another; and
  - filling in at least a portion of the number of trenches with a dielectric material;
- forming a microprocessor; and
- forming a bus coupled between the memory array and the microprocessor.

18. The method of claim 17, wherein forming the number of conductive elements and forming the number of supplemental elements includes concurrently forming a number of conductive elements and a number of supplemental elements.

19. The method of claim 17, further including filling the number of trenches with a dielectric material to form a substantially planar surface.

20. The method of claim 19, wherein filling the number of trenches with a dielectric material includes utilizing a spin-on-glass process to form a substantially planar surface.

21. The method of claim 19, wherein filling the number of trenches with a dielectric material includes utilizing a chemical vapor deposition (CVD) process to form a substantially planar surface.

22. The method of claim 19, wherein filling the number of trenches with a dielectric material to form a substantially planar surface includes utilizing a single process operation to fill the number of trenches with a dielectric material to form a substantially planar surface.

23. A method of fabricating a semiconductor wafer, comprising:
- forming a pattern of elements on a semiconductor surface, including:
  - forming a number of conductive elements on the semiconductor surface, the conductive elements being spaced apart from each other; and
  - forming a number of supplemental elements in selected regions on the semiconductor surface adjacent to the number of conductive elements, the supplemental elements being spaced apart from each other and the number of conductive elements;
- wherein spaces between elements of the pattern define a number of trenches with trench axes that are substantially parallel to sides of adjacent elements of the pattern;
- designing the pattern to substantially eliminate portions of the pattern where trench axes cross one another; and
- filling the number of trenches with a dielectric material to form a substantially planar surface, wherein a single process operation is used to fill the number of trenches.

24. The method of claim 23, wherein forming the number of conductive elements includes forming a number of conductive metal trace lines.

25. The method of claim 23, wherein forming the number of supplemental elements includes forming a number of metal supplemental elements.

26. The method of claim 23, wherein forming the number of conductive elements and forming the number of supplemental elements includes concurrently forming a number of conductive elements and a number of supplemental elements.

27. The method of claim 23, wherein filling the number of trenches with a dielectric material includes utilizing a spin-on-glass process to form a substantially planar surface.

28. The method of claim 23, wherein filling the number of trenches with a dielectric material includes utilizing a chemical vapor deposition (CVD) of tetraethylorthosilicate (TEOS) to form a substantially planar surface.

29. The method of claim 23, wherein filling the number of trenches with a dielectric material to form a substantially planar surface includes utilizing a single process operation to fill the number of trenches with a dielectric material to form a substantially planar surface.

30. A method of fabricating a semiconductor wafer, comprising:
- forming a pattern of elements on a semiconductor surface, including:
  - forming a number of conductive elements on the semiconductor surface, the conductive elements being spaced apart from each other; and
  - forming a number of supplemental elements in selected regions on the semiconductor surface adjacent to the number of conductive elements, the supplemental elements being spaced apart from each other and the number of conductive elements;
- wherein spaces between elements of the pattern define a number of trenches with trench axes that are substantially parallel to sides of adjacent elements of the pattern;
- designing the pattern to substantially eliminate portions of the pattern where trench axes cross one another;
- filling the number of trenches with a dielectric material to form a substantially planar surface; and
- forming at least one electrical contact between the planar surface through the dielectric material to a selected conductive element.

31. The method of claim 30, wherein forming at least one electrical contact includes forming at least one low aspect ratio electrical contact.

32. The method of claim 30, wherein forming the number of conductive elements and forming the number of supplemental elements includes concurrently forming a number of conductive elements and a number of supplemental elements.

33. The method of claim 30, wherein filling the number of trenches with a dielectric material includes utilizing a spin-on-glass process to form a substantially planar surface.

34. The method of claim 30, wherein filling the number of trenches with a dielectric material includes utilizing a chemical vapor deposition (CVD) process to form a substantially planar surface.

35. The method of claim 30, wherein filling the number of trenches with a dielectric material to form a substantially planar surface includes utilizing a single process operation to fill the number of trenches with a dielectric material to form a substantially planar surface.

* * * * *